(12) United States Patent
Beintner et al.

(10) Patent No.: US 6,667,504 B1
(45) Date of Patent: Dec. 23, 2003

(54) SELF-ALIGNED BURIED STRAP PROCESS USING DOPED HDP OXIDE

(75) Inventors: Jochen Beintner, Wappingers Falls, NY (US); Wolfgang Bergner, Stormville, NY (US); Richard A. Conti, Katonah, NY (US); Andreas Knorr, Austin, TX (US); Rolf Weis, Wappingers Falls, NY (US)

(73) Assignees: International Business Machines Corporation, Armonk, NY (US); Infineon Technologies North America Corporation, San Jose, CA (US)

( * ) Notice: Subject to any disclaimer, the term of this patent is extended or adjusted under 35 U.S.C. 154(b) by 0 days.

(21) Appl. No.: 10/249,228

(22) Filed: Mar. 24, 2003

(51) Int. Cl.[7] .................. H01L 27/108; H01L 29/76; H01L 29/94; H01L 31/119
(52) U.S. Cl. ........................ 257/302; 257/301
(58) Field of Search ................ 257/301, 302, 257/303, 304, 305

(56) References Cited

U.S. PATENT DOCUMENTS

| | | | |
|---|---|---|---|
| 6,090,660 A | * | 7/2000 | Noble, Jr. ............. 438/243 |
| 6,432,774 B2 | | 8/2002 | Heo et al. |
| 6,509,599 B1 | * | 1/2003 | Wurster et al. ......... 257/301 |
| 2002/0196651 A1 | * | 12/2002 | Weis .................. 365/100 |

* cited by examiner

*Primary Examiner*—Ngân V. Ngô
(74) *Attorney, Agent, or Firm*—McGinn & Gibb, PLLC; Steven Capella, Esq.

(57) ABSTRACT

The invention provides a trench storage structure that includes a substrate having a trench, a capacitor conductor in the lower part of the trench, a conductive node strap in the trench adjacent the capacitor conductor, a trench top oxide above the capacitor conductor, and a conductive buried strap in the substrate adjacent the trench top oxide. The trench top oxide includes a doped trench top oxide layer above the conductive strap, and an undoped trench top oxide layer above the doped trench top oxide layer.

11 Claims, 9 Drawing Sheets

SELF-ALIGNED BURIED STRAP PROCESS USING DOPED HDP OXIDE

BACKGROUND OF INVENTION

The present invention generally relates to the formation of vertical, shallow, and lightly doped, junctions for a vertical transistor, and more particularly to an improved method/structure that makes it possible to process a buried contact with reduced outdiffusion while still maintaining sufficient overlap between the buried contact and the transistor channel.

With further shrinking of groundrules for logic and dynamic random access memory (DRAM) devices, development of improvements becomes necessary. In case of planar logic and DRAM devices, short channel effects limit device performance. For DRAMs with vertical access transistor, the buried contact outdiffusion has to be reduced for isolation reasons, but connectivity to the select transistor must be assured. The invention described below processes a shallow buried contact by reducing the outdiffusion without degrading the connectivity to the select transistor.

SUMMARY OF INVENTION

The invention provides a trench storage structure that includes a substrate having a trench, a capacitor in the lower part of the trench, a conductive node strap in the trench adjacent the capacitor conductor, a trench top oxide above the conductive strap, and a conductive buried strap in the substrate adjacent the trench top oxide. The trench top oxide includes a doped trench top oxide layer above the conductive strap, and an optional undoped trench top oxide layer above the doped trench top oxide layer.

The dopant in the doped trench top oxide layer comprises the same type of dopant in the conductive buried strap. A percentage by weight of dopant in the doped trench top oxide layer is less than 1%. The structure also includes a gate conductor in the trench above the undoped trench top oxide layer. The trench top oxide layer insulates the gate conductor from the capacitor conductor.

The invention also provides a method of forming a memory device that patterns a trench, forms the capacitor dielectric, fills the lower portion of the trench with a capacitor conductor, deposits a conductive node strap in the trench above the capacitor conductor, forms a trench top oxide in the trench adjacent the top of the conductive strap, and heats the structure to form a conductive buried strap in the substrate adjacent the trench top oxide. The trench top oxide is formed by depositing a doped trench top oxide layer above the conductive strap, and forming an optional undoped trench top oxide layer above the doped trench top oxide layer.

The process of depositing the doped trench top oxide layer comprises a high density plasma-chemical vapor deposition (HDP-CVD) process that includes the following parameters: silane reactant gas flow 10–75 sccm; approximate bias plasma power 300–1000 W; and phosphine gas delivery at gas flows below 5 sccm. This processing forms the percentage by weight of dopant in the doped trench top oxide layer to be less than 1%.

To further shrink the vertical DRAM cell, with the invention, the lateral outdiffusion of the buried strap is reduced to avoid interaction between adjacent DRAM cells, while still maintaining a low resistive path to the channel region of the vertical transistor. By reducing the thermal budget of the entire process, the invention outdiffuses dopant from the doped TTO layer and reduces the outdiffusion of the buried strap. Thus, both lateral and vertical outdiffusions are reduced. Sufficient overlap between the buried strap and the transistor channel is not assured with conventional processes that only rely upon outdiffusion from the trench conductor and the node strap to form the buried strap. This is why a portion of the TTO is doped in the inventive structure. In addition, the inventive HDP-CVD TTO deposition process was developed to provide good dopant control in the oxide, to consistently achieve this structure.

BRIEF DESCRIPTION OF DRAWINGS

The invention will be better understood from the following detailed description of preferred embodiments of the invention with reference to the drawings, in which.

DETAILED DESCRIPTION

With further shrinking of groundrules for LOGIC and DRAM devices, development of shallow junctions becomes feasible. The invention uses doped oxides (e.g., As P, etc.) as dopant sources for solid state outdiffusion, thereby allowing processing of shallow junctions.

Figure 1:
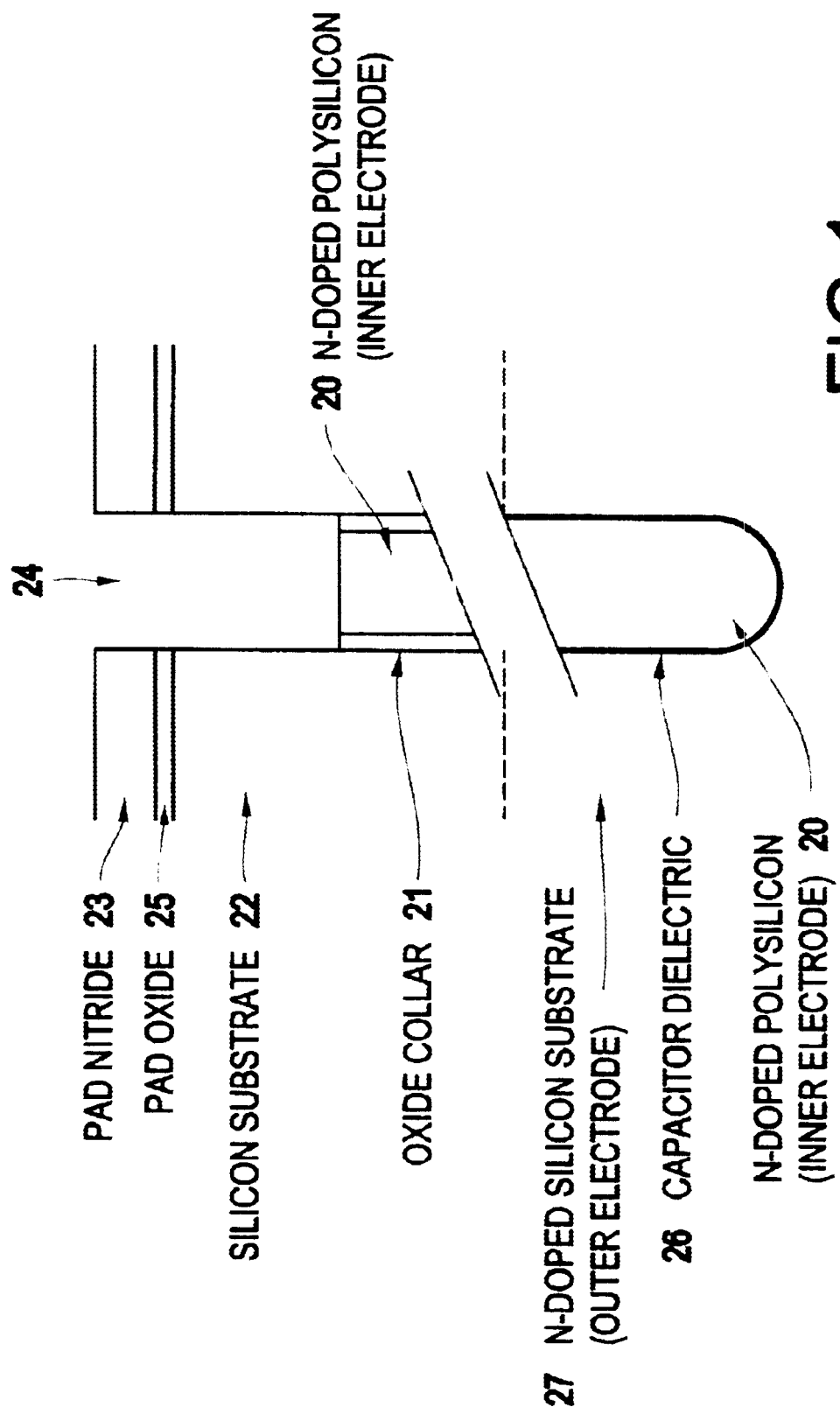
FIG. 1 is a schematic diagram of a partially completed storage device.

More specifically, FIG. 1 illustrates the very upper and very lower portions of a deep trench 24 formed in a substrate (e.g., single crystal silicon) structure 22 having a dielectric (e.g., pad nitride 23, formed by chemical vapor deposition (CVD) or physical vapor deposition (PVD) and thermally grown pad oxide 25) upper pad surface. The trench 24 can be formed using any well-known formation and patterning techniques.

To form the capacitor a dielectric film 26 is deposited or grown in the deep trench 24. Then, the deep trench 24 is filled with a conductive trench node material 20, such as N+ doped polysilicon, the upper portion of which is surrounded by a collar dielectric 21 (e.g., oxide). The outer electrode 27 comprises the N-doped silicon substrate 27, shown in FIG. 1. The deep trench conductor 20 and collar dielectric 21 can be formed using any of a number of well-known techniques. For example, the trench can be lined with an insulating dielectric (not illustrated) and then partially filled with a first level of conductor material. Then, the collar dielectric 21 (such as silicon dioxide) can be deposited. The collar oxide is etched in, for example, an anisotropic dry etch process such as reactive ion etching (RIE) using a mixture of gases which may include some portions of $CHF_3$, Ar, $O_2$, $C_4 F_8$, and CO. The anisotropic dry etch, or sidewall spacer etch, removes material in a vertical direction at a high rate, but removes material in the horizontal direction at a relatively low rate. The highly selective anisotropic spacer etch leaves material along the sidewall of the trenches, but removes material from the horizontal surfaces. The trench 24 is then completely filled with more of the conductor 20 and then etched back. Then, the collar dielectric 21 is etched down to be level with the top surface of the second level of polysilicon 20.

Figure 2:
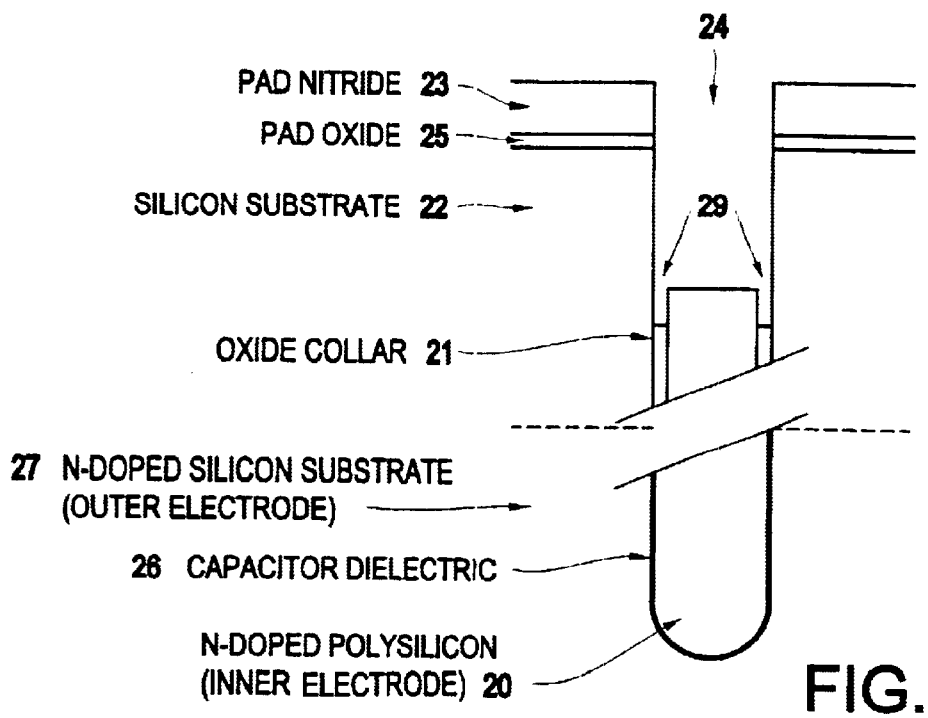
FIG. 2 is a schematic diagram of a partially completed storage device.
Figure 3:
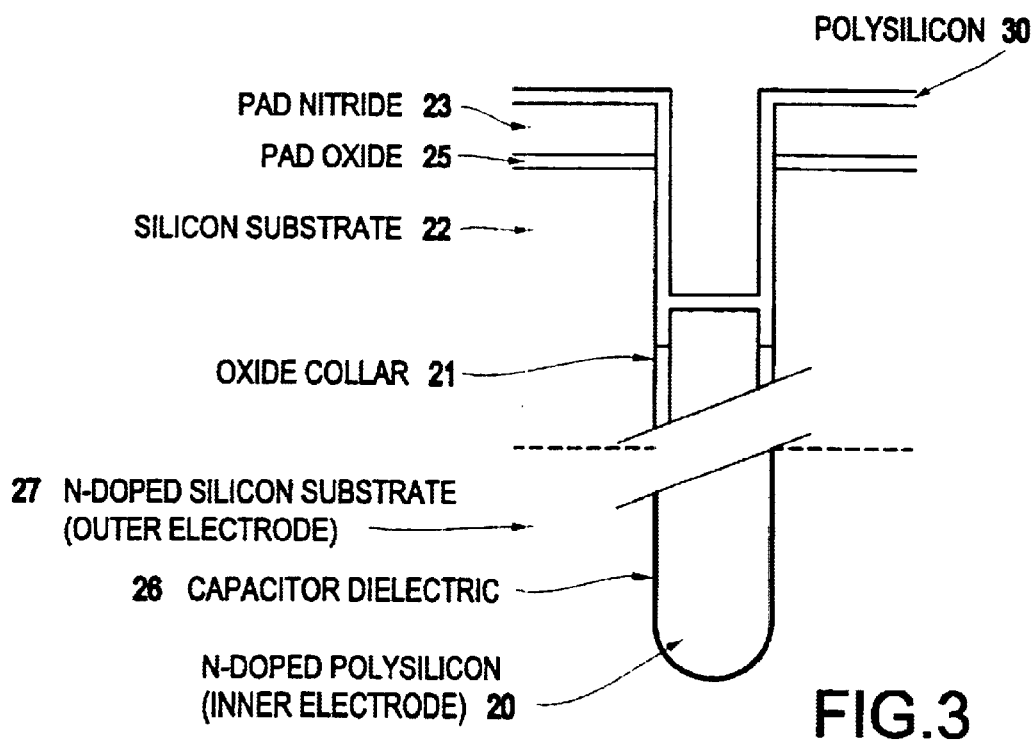
FIG. 3 is a schematic diagram of a partially completed storage device.
Figure 4:
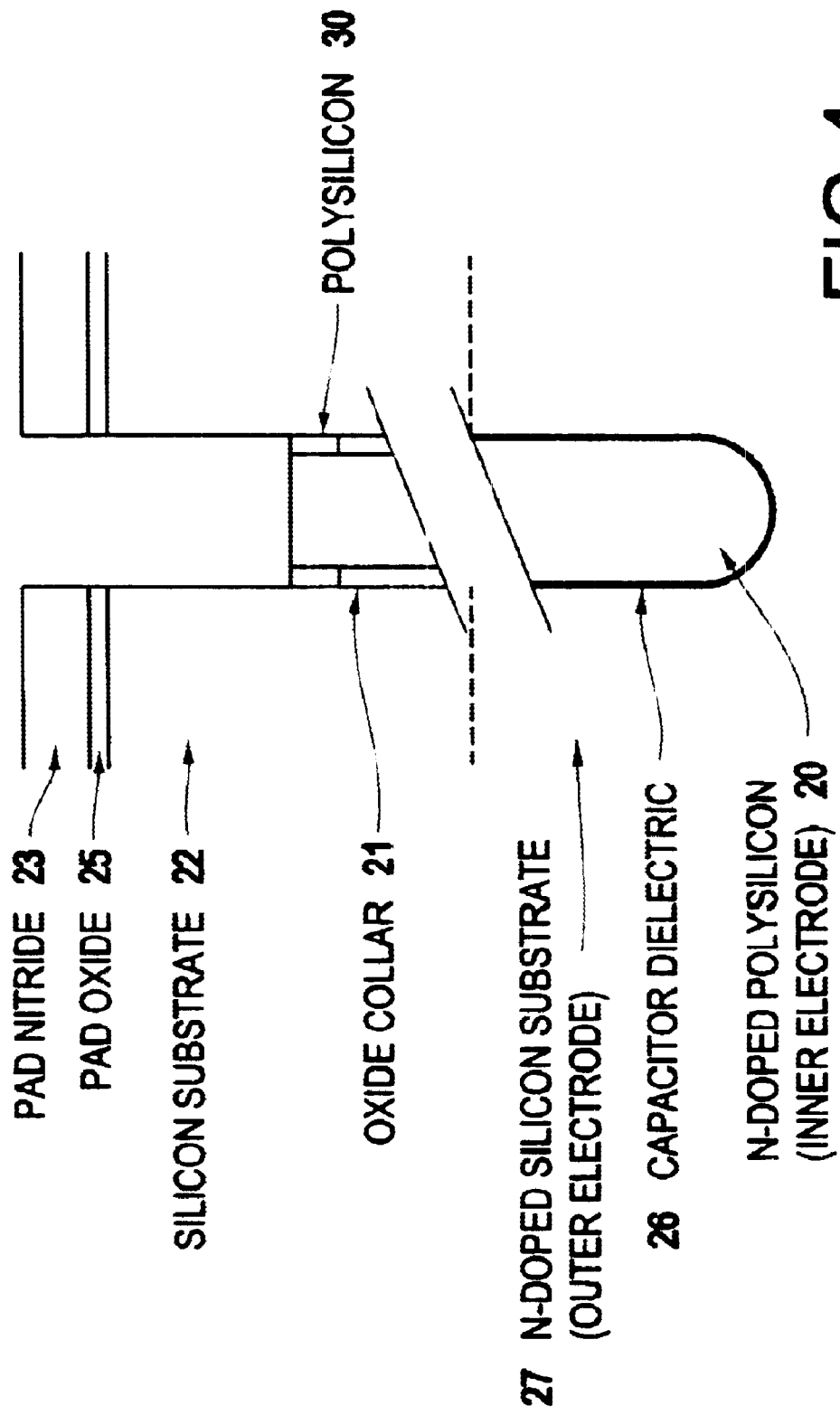
FIG. 4 is a schematic diagram of a partially completed storage device.

The upper portion of the collar oxide 21 is removed using a selective etching process that aggressively attacks the oxide 21 without substantially affecting the silicon substrate 22 or the conductor 20, as shown by item 29 in FIG. 2. Next as shown in FIG. 3, a conductive node strap material 30 is deposited in a conformal deposition process that allows the conductive node strap material 30 to fill in the gaps 29 between the trench conductor 20 and the sidewalls of the trench that were created when the upper portion of the collar oxide 21 was removed. Any excess conductive material is removed from the structure down to the top of the polysilicon 20, as shown in FIG. 4.

Figure 5:
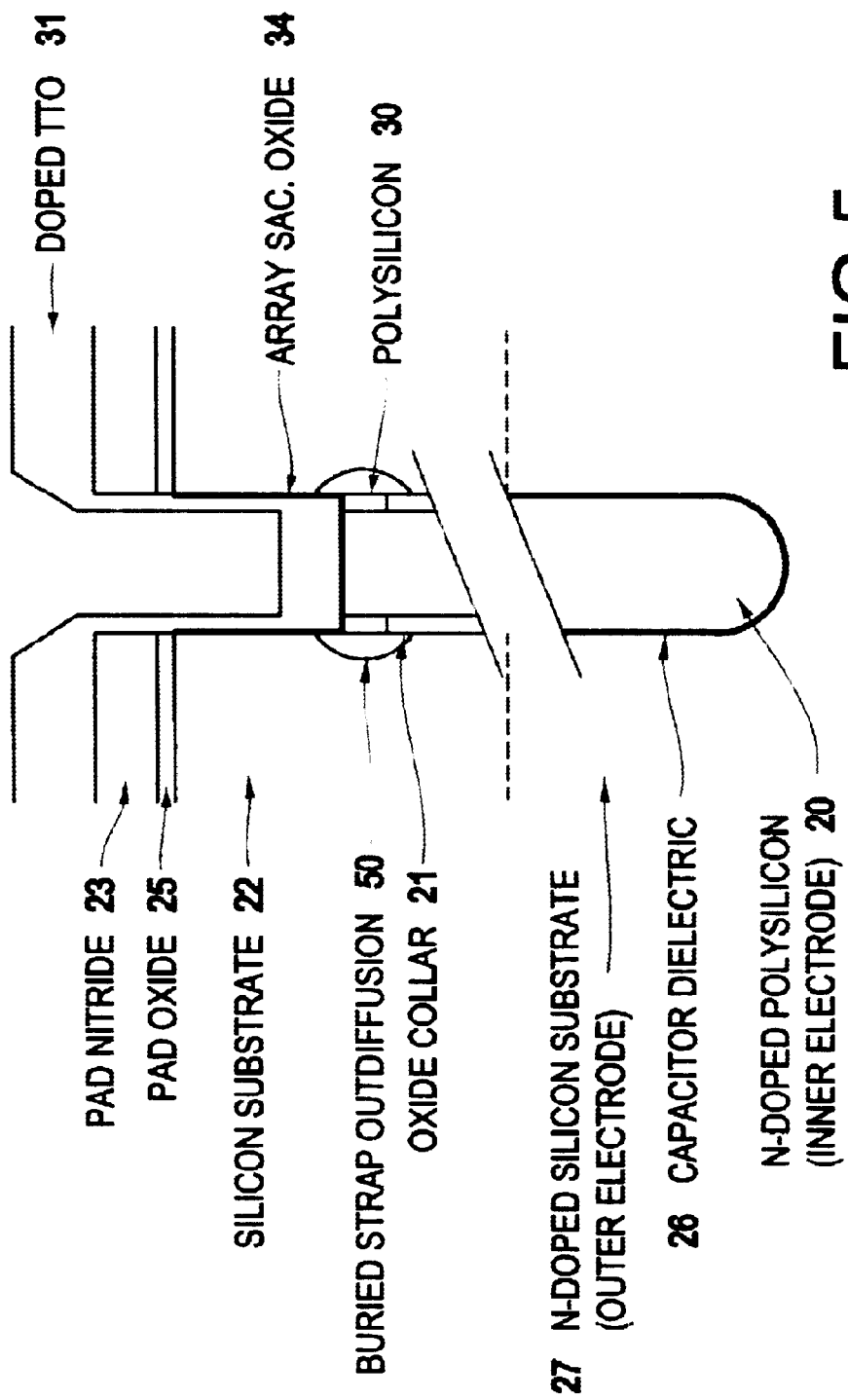
FIG. 5 is a schematic diagram of a partially completed storage device.
Figure 6:
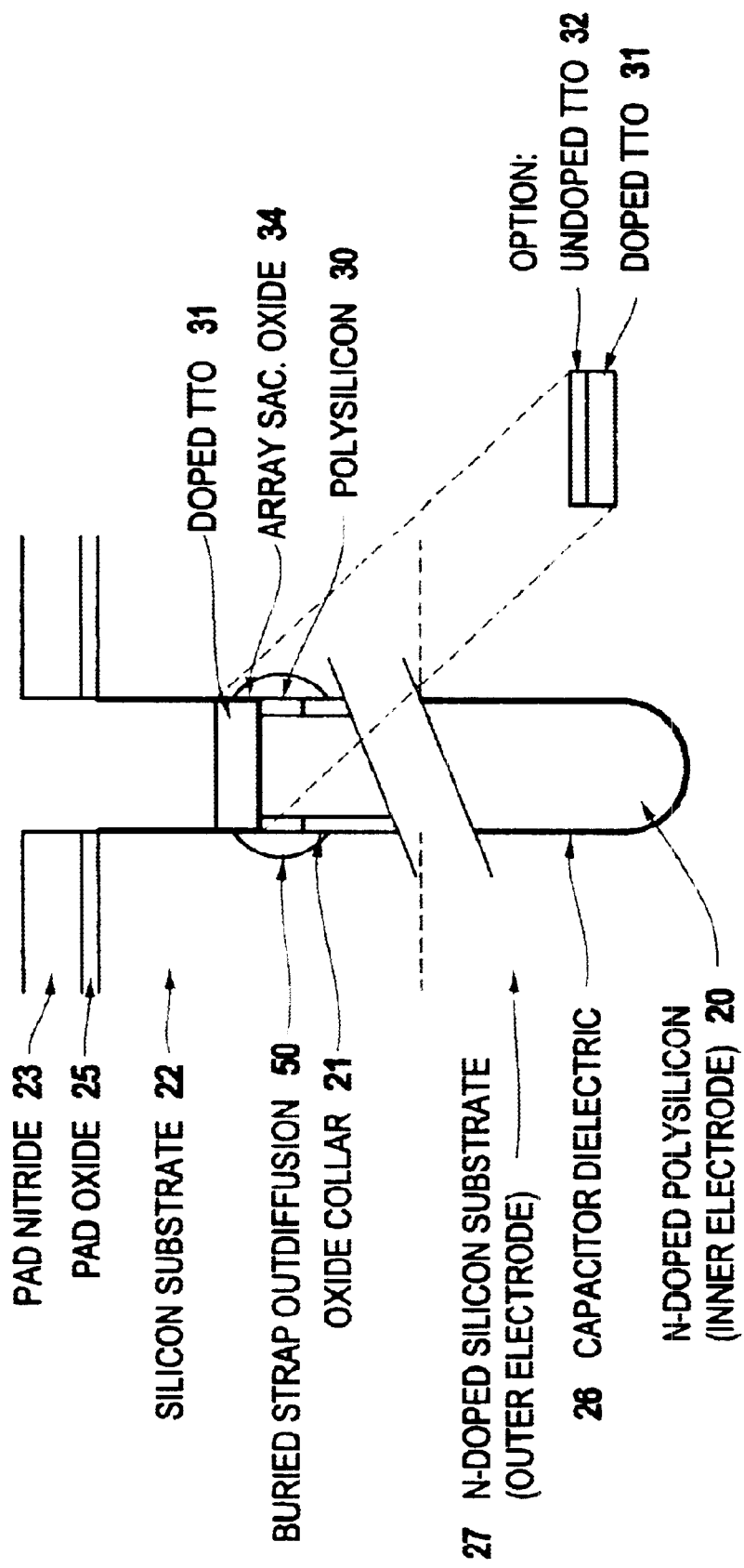
FIG. 6 is a schematic diagram of a partially completed storage device.

The processing shown in FIG. 5 includes the thermal formation of a vertical sacrificial oxide 34. The sacrificial oxide acts as a diffusion barrier to the dopant of the doped TTO. This thermal processing also diffuses dopant from the polysilicon 30 to from the buried strap outdiffusion, which is a conductive region 50 adjacent, the polysilicon strap 30. A doped high density plasma (HDP) trench top oxide (TTO) 31 such as tetraethylorthosilicate (TEOS) or similar material is then deposited in a chemical vapor deposition (CVD) process. The upper portion of the doped TTO 31 is then removed using any well-known selective removal technique (e.g., wet HF etch back), as shown in FIG. 6. The etch back process allows a sufficient thickness of the doped TTO 31 to remain to provide adequate insulation between the underlying capacitor conductor 20 and the gate conductor that will be formed in the upper portion of the trench. As shown by the cut away section in FIG. 6, the invention optionally includes the deposition of an undoped HDP oxide 32 over the doped TTO 31. In such an option, the trench top oxide (TTO) comprises both the first doped layer 31 and the undoped layer 32. The upper oxide portion 32 of the TTO is preferably undoped to prevent potentially unwanted short circuiting between the gate conductor 40 and the trench conductor 20. The doping of the TTO 31 is tightly controlled so as to limit excessive outdiffusion. The TTO 31 is preferably very lightly doped with arsenic or phosphorus in concentrations less than 1% dopant by weight.

Layers 31, 32 are deposited using a technique that allows the sidewall thickness of the deposited oxide to be uniform and thinner than the deposit at the bottom of the structure. One technique for the deposition of the doped 31 and undoped 32 films utilizes a specifically modified and optimized high density plasma (HDP) chemical vapor deposition (CVD) process (referred to herein as "HDP-CVD"). More specifically, with the invention the HDP-CVD process is optimized in order to reduce the deposition rate by reducing the silane reactant gas flow from typically 150–200 to 10–75 sccm. Sidewall to bottom thickness ratios of <1:5 are achieved by reducing the bias plasma power (from typically 2000–4000 W to 300–1000 W) which increases the deposition to sputter component. Lower dopant levels can be realized by modification of the phosphine gas delivery to allow gas flows below 5 sccm. This process allows the sidewall thickness of the deposited oxide to be uniform and thinner than the deposit at the bottom of the structure. Conventional TTO deposition techniques such as PECVD, LPCVD and $O_3$-TEOS CVD do not exhibit these characteristics.

Also, this HDP-CVD process produces high quality films with low wet etch rate ratios to thermal oxide (<1:1.3) and has the ability to fill trench structures up to aspect ratios of 3.5. The aspect ratio describes the ratio of trench depth to opening width. HDP processes have been used in shallow trench isolation regions (un-doped $SiO_2$) and pre-metal dielectrics (phosphorus silicon glass with dopant levels of 5–8 atomic %). However, conventional HDP processes cannot be utilized to form the TTO, since the deposition rate of such conventional processes is too high to controllably and repeatably deposit films below 100 nm. Further, with conventional HDP processes, the ratio of sidewall to bottom thickness does not allow sidewall removal with an appropriate process window and the P-concentration of the phosphorus silicon glass is much to high for the desired final contact doping.

To use HDP-CVD for the formation of the TTO (and the resulting self-aligned buried strap) is unconventional since HDP is traditionally used for different applications and the conventional HDP process itself needs to be drastically modified in order meet the TTO requirements. The inventive HDP-CVD process is also useful for different applications where low sidewall to bottom thickness ratios and dopant concentrations are desirable.

Figure 7:
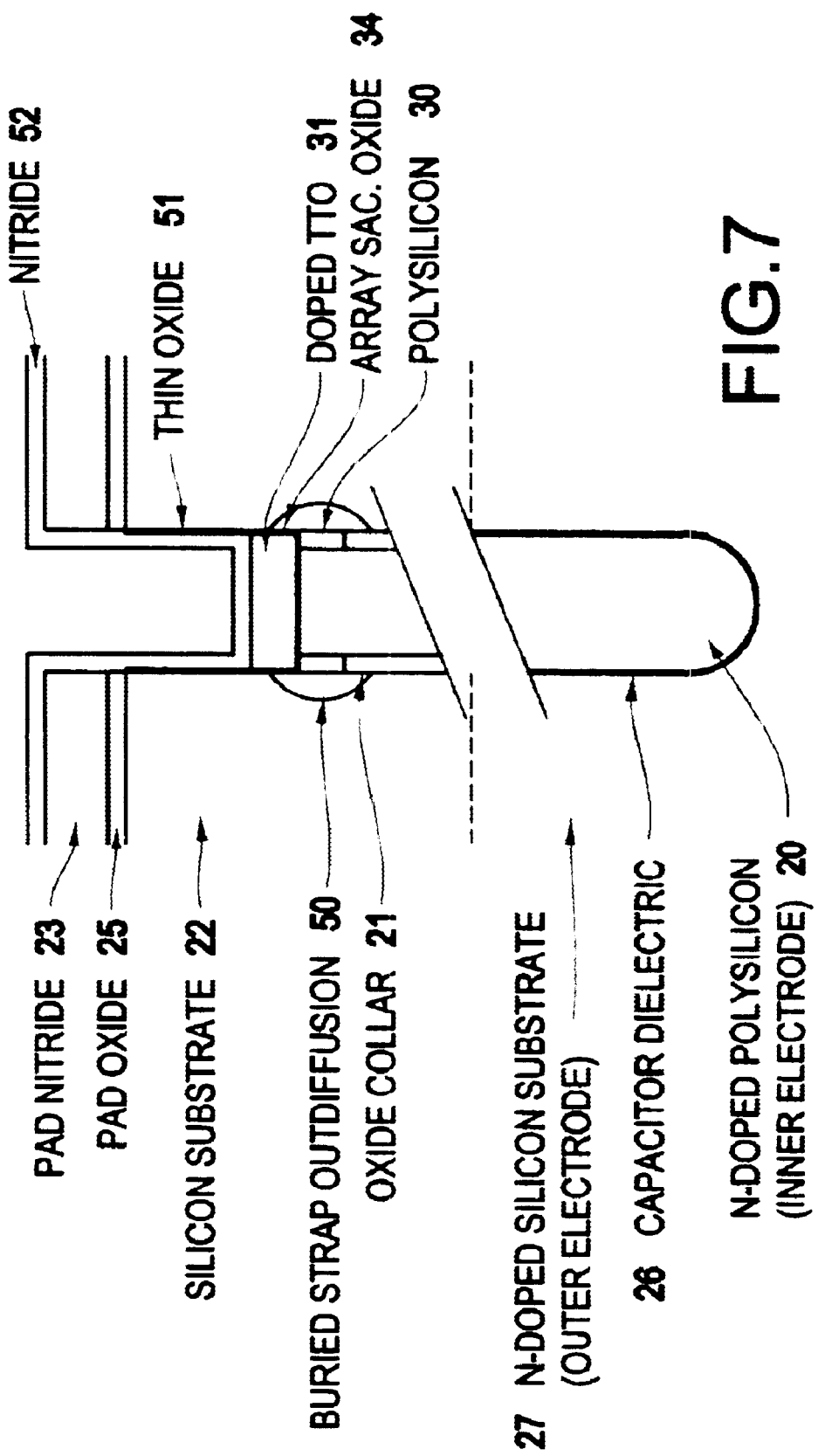
FIG. 7 is a schematic diagram of a partially completed storage device.
Figure 8:
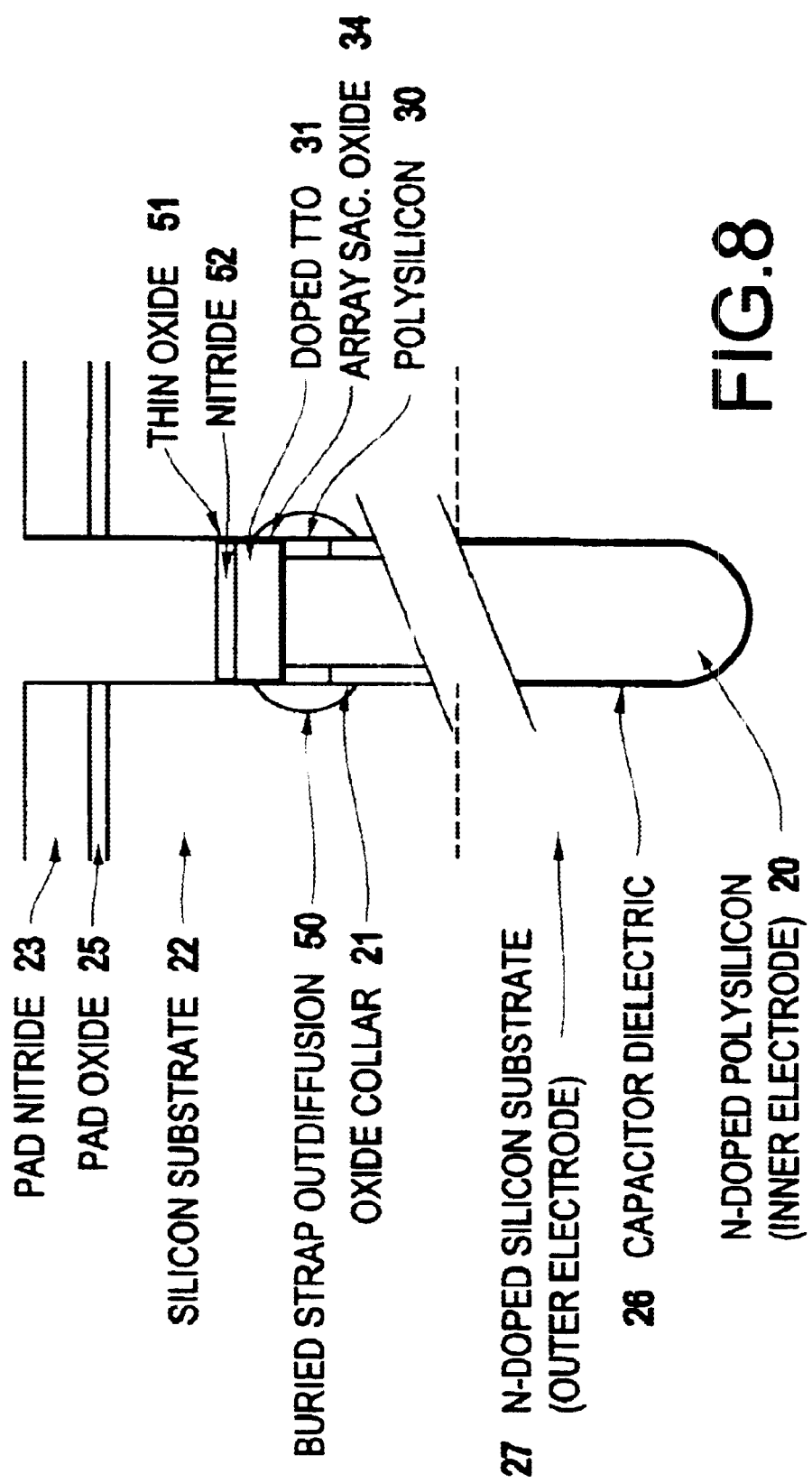
FIG. 8 is a schematic diagram of a partially completed storage device.
Figure 9:
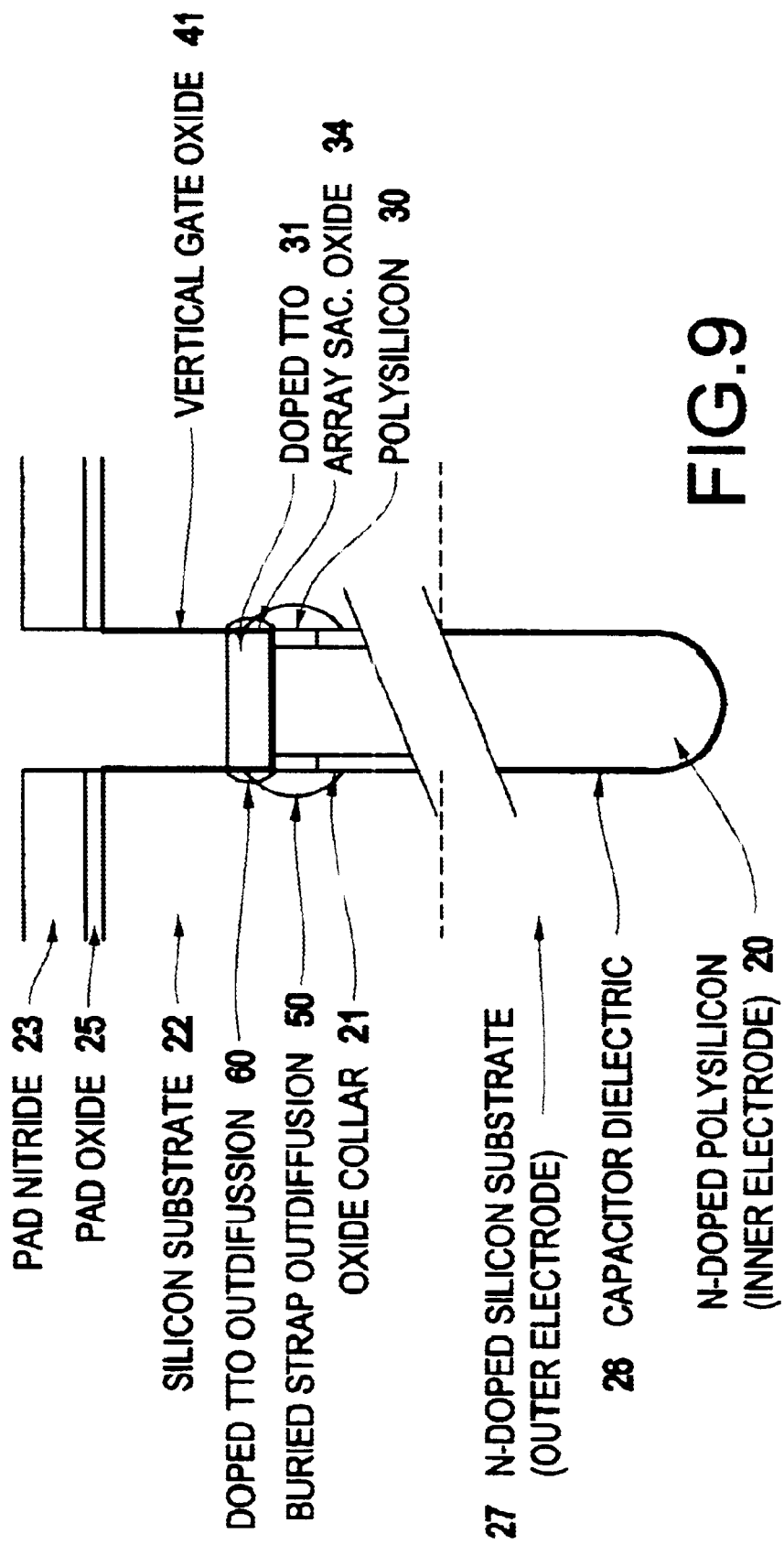
FIG. 9 is a schematic diagram of a partially completed storage device.

As shown in FIG. 7, a thin oxide 51 is grown along the exposed portions of the silicon substrate 22 and a nitride 52 is deposited. In FIG. 8, the nitride 52 and oxide 51 are removed in an etch back process to leave enough nitride 52 to protect the underlying TTO 31. In FIG. 9, a vertical gate oxide insulator 41 is formed along the upper sidewalls of the trench in a thermal process, after which the nitride 52 is removed. This thermal process outdiffuses the doped TTO outdiffusion, thereby forming another conductive buried strap region 60 that overlaps the first conductive buried strap region 50 and forms a continuous electrical path (comprising 20, 30, 50, and 60) to the capacitor conductor 20. The first (lower) buried strap conductive region 50 is substantially adjacent the polysilicon strap 30 and the second (upper) buried strap conductive region 60 is substantially adjacent the TTO 31; however, there is some overlap between the upper and lower buried straps (60, 50).

Figure 10:
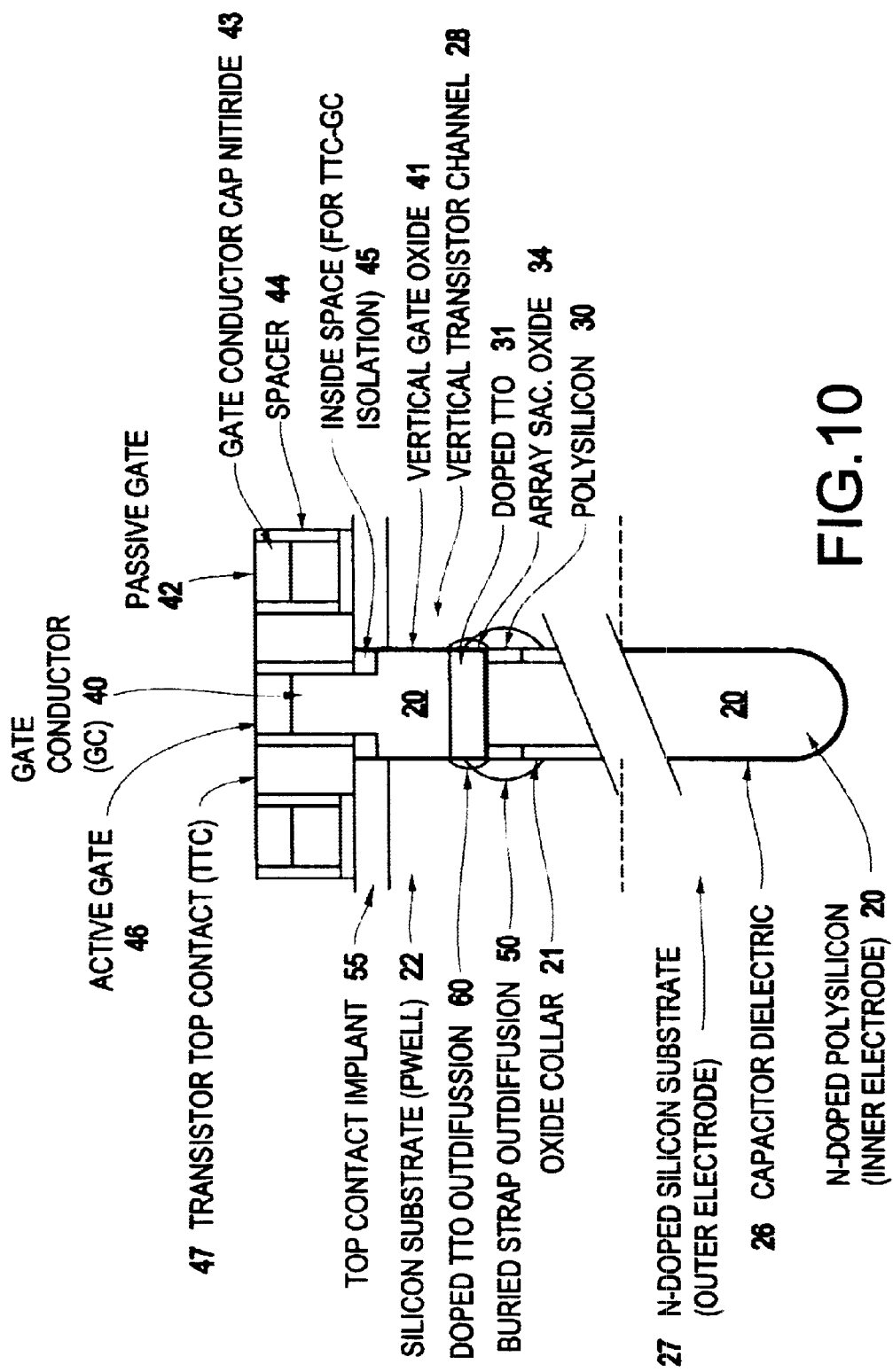
FIG. 10 is a schematic diagram of a completed storage device.

FIG. 10 illustrates the active 46 as well as the passive 42 gates. The silicon substrate 22 is doped to form the p-well. Item 28 represents the channel region of the transistor that results from the p-well doping. The pad nitride 23 and pad oxide 25 are removed and a top contact implant is made. Next, as shown in FIG. 10, a gate conductor 40 (doped polysilicon, metal, alloy, etc.) is deposited in the remaining upper portion of the trench. Isolation regions 45 are patterned into the gate conductor 40 and gate conductor nitride caps 43, spacers 44, and transistor top contacts (TTC) 47 are formed, using well-known processing. FIG. 10 illustrates one single structure that would be included in an array of similar structures. The adjacent structures are separated from one another by isolation regions.

Current/voltage in the gate conductor (40) causes the channel region (28) to become conductive, thereby forming a conductive path from the capacitor conductor (20), through the polysilicon strap (30), the lower and upper conductive buried straps (50, 60), the transistor channel (28) in the p-well (22), the conductive contact implant (55), and finally to the transistor top contact (47).

The TTO 31 produces the doped TTO outdiffusion 60 in a relatively low temperature process. Further, the higher temperatures normally needed to cause a larger buried strap outdiffusion 50 can be avoided because the buried strap outdiffusion 50 does not need to be as large with the invention. Normally, the buried strap outdiffusion 50 needs to be made large enough to make the silicon next to the trench top oxide conductive. However, the inventive doped TTO outdiffusion 60 allows the buried strap outdiffusion 50 to be smaller (utilizing lower temperature thermal cycles) by providing a separate conductive region 60 adjacent the trench top oxide 31. Thus, the temperature of the thermal cycles (thermal budget) can be reduced. To the contrary, conventional processes that only rely upon outdiffusion from the trench conductor 20 and the node strap 30 to form the buried strap 50 must use substantially higher temperatures to achieve a conductive region adjacent the TTO.

As mentioned above, to further shrink the vertical DRAM cell, the lateral and vertical outdiffusion 50 from the polysilicon strap 30 is reduced (using lower temperature thermal cycles) to avoid interaction between adjacent DRAM cells while still maintaining a low resistive path to the channel region 28 of the vertical transistor. Along with reducing the outdiffusion 50 from the conductive strap 30, the invention outdiffuses dopant 60 from the doped TTO layer 31 to ensure that a conductive path exists from the capacitor conductor 20 to the channel 28. To assure good isolation between the conductors 20 and 40, and sufficient process control for the oxide deposition, the trench top oxide 31, 32 should have a certain thickness (e.g., approximately 300 A). Considering that the process tolerance is +/−100 A, sufficient overlap between the conductive region 50 and transistor channel 28 is not assured with conventional processes that only rely upon outdiffusion from the trench conductor 20 and the node strap 30. This is why at least a portion 31 of the TTO is doped in the inventive structure. The inventive HDP-CVD TTO deposition process was developed to provide good dopant control in the oxide 31, to consistently achieve this structure.

To further shrink the vertical DRAM cell, with the invention, the lateral outdiffusion of the buried strap is reduced to avoid interaction between adjacent DRAM cells, while still maintaining a low resistive path to the channel region of the vertical transistor. By reducing the thermal budget of the entire process, the invention outdiffuses dopant from the doped TTO layer and reduces the outdiffusion of the buried strap. Thus, both lateral and vertical outdiffusions are reduced. Sufficient overlap between the buried strap and the transistor channel is not assured with conventional processes that only rely upon outdiffusion from the trench conductor and the node strap to form the buried strap. This is why a portion of the TTO is doped in the inventive structure. In addition, the inventive HDP-CVD TTO deposition process was developed to provide good dopant control in the oxide, to consistently achieve this structure.

While the invention has been described in terms of preferred embodiments, those skilled in the art will recognize that the invention can be practiced with modification within the spirit and scope of the appended claims.

What is claimed is:

1. A trench storage structure comprising:
   a substrate having a trench;
   a capacitor conductor in a lower part of said trench;
   a doped trench top oxide in said trench above said capacitor conductor; and
   a conductive buried strap in said substrate adjacent said trench top oxide.

2. The structure in claim 1, wherein said doped trench top oxide and said conductive buried strap have the same doping impurity.

3. The structure in claim 1, further comprising an undoped trench top oxide in said trench above said doped trench top oxide.

4. The structure in claim 3, further comprising a gate conductor in said trench above said undoped trench top oxide layer, wherein said undoped trench top oxide layer insulates said gate conductor from said capacitor conductor.

5. The structure in claim 1, wherein a percentage by weight of dopant in said doped trench top oxide is less than 1%.

6. A trench storage structure comprising:
   a substrate having a trench;
   a capacitor conductor in a lower part of said trench; and
   a trench top oxide in said trench above said capacitor conductor, wherein said trench top oxide includes:
   a doped trench top oxide layer; and
   an undoped trench top oxide layer above said doped trench top oxide layer.

7. The structure in claim 6, further comprising a conductive node strap in said trench adjacent said capacitor conductor.

8. The structure in claim 6, further comprising a conductive buried strap in said substrate adjacent said trench top oxide.

9. The structure in claim 8, wherein said doped trench top oxide layer and said conductive buried strap have the same doping impurity.

10. The structure in claim 6, further comprising a gate conductor in said trench above said undoped trench top oxide layer, wherein said undoped trench top oxide layer insulates said gate conductor from said capacitor conductor.

11. The structure in claim 6, wherein a percentage by weight of dopant in said doped trench top oxide layer is less than 1%.

* * * * *